(12) United States Patent
Brunner et al.

(10) Patent No.: US 12,116,270 B2
(45) Date of Patent: Oct. 15, 2024

(54) DEVICE FOR SUPPORTING MEMS AND/OR ASIC COMPONENTS

(71) Applicant: TE Connectivity Solutions GmbH, Steinach (CH)

(72) Inventors: Ismael Brunner, Bevaix (CH); Jean-Francois Le Neal, Bevaix (CH); Thomas Arnold, Bevaix (CH)

(73) Assignee: TE Connectivity Solutions GmbH, Schaffhausen (CH)

( * ) Notice: Subject to any disclaimer, the term of this patent is extended or adjusted under 35 U.S.C. 154(b) by 17 days.

(21) Appl. No.: 17/668,865

(22) Filed: Feb. 10, 2022

(65) Prior Publication Data
US 2022/0250902 A1 Aug. 11, 2022

(30) Foreign Application Priority Data
Feb. 10, 2021 (EP) ...................................... 21156379

(51) Int. Cl.
*B81B 7/00* (2006.01)
*B81C 1/00* (2006.01)

(52) U.S. Cl.
CPC .......... *B81B 7/007* (2013.01); *B81C 1/00301* (2013.01); *B81B 2207/012* (2013.01); *B81B 2207/095* (2013.01)

(58) Field of Classification Search
CPC ...... B81B 2207/012; B81B 2201/0264; B81B 2207/097; B81B 7/02; B81B 7/0006; B81B 7/007; B81B 2207/095; B81C 1/00301
See application file for complete search history.

(56) References Cited

U.S. PATENT DOCUMENTS

| | | | |
|---|---|---|---|
| 2005/0262929 A1* | 12/2005 | Felton | B81C 1/0023 73/104 |
| 2014/0072151 A1 | 3/2014 | Ochs et al. | |
| 2014/0374848 A1* | 12/2014 | Koh | H01L 23/315 257/415 |
| 2020/0353268 A1 | 11/2020 | Yang et al. | |

FOREIGN PATENT DOCUMENTS

EP     3309826 A1    4/2018

OTHER PUBLICATIONS

Extended European Search Report, Application No. 21156379.6-1230, dated Nov. 11, 2021, 11 pages.

* cited by examiner

*Primary Examiner* — Samuel A Gebremariam
(74) *Attorney, Agent, or Firm* — Barley Snyder

(57) ABSTRACT

A device including a first layer, a MEMS component and/or an ASIC component on the first layer, and a second layer having a cavity receiving the MEMS component and/or the ASIC component. The second layer has a feedthrough for transmission of at least one of an electrical signal, an electromagnetic signal, a fluid, and a force.

19 Claims, 6 Drawing Sheets

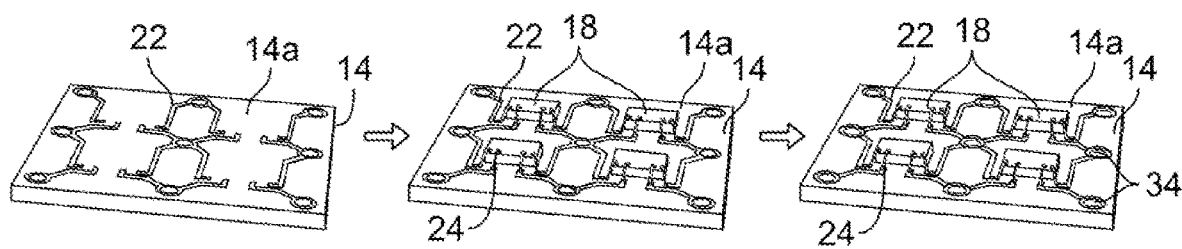
Fig. 6a  Fig. 6b  Fig. 6c
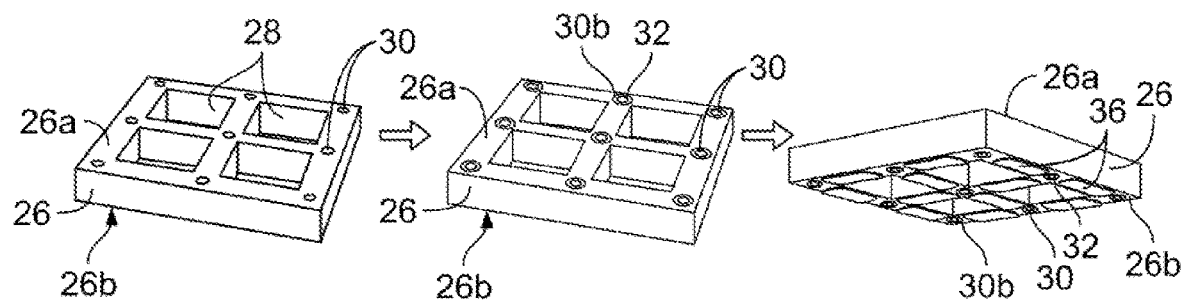
Fig. 7a  Fig. 7b  Fig. 7c
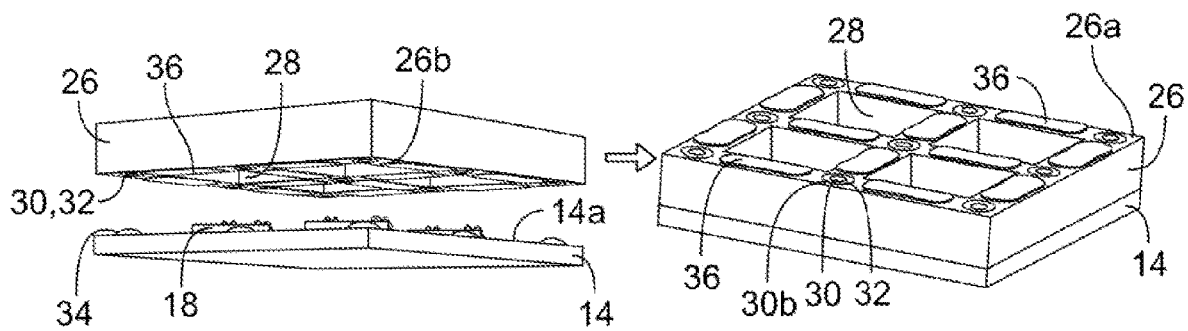
Fig. 8a  Fig. 8b
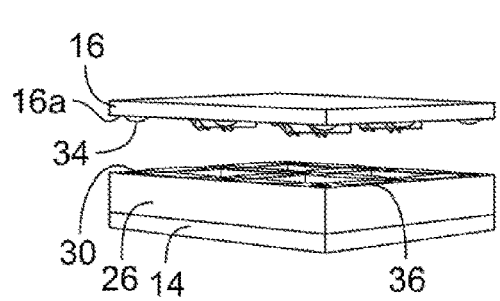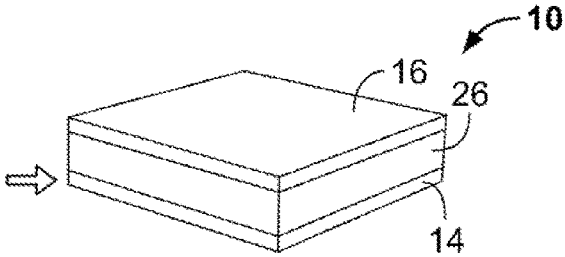
Fig. 9a  Fig. 9b

DEVICE FOR SUPPORTING MEMS AND/OR ASIC COMPONENTS

CROSS-REFERENCE TO RELATED APPLICATIONS

This application claims the benefit of the filing date under 35 U.S.C. § 119(a)-(d) of European Patent Application No. 21156379.6, filed on Feb. 10, 2021.

FIELD OF THE INVENTION

The present invention relates to a device for supporting elements and, more particularly to a device for supporting micro-electro-mechanical systems (MEMS) and/or Application Specific Integrated Circuit (ASIC) components.

BACKGROUND

MEMS can consist of pressure sensors, temperature sensors, accelerometers (variable capacitive or piezoresistive), force sensors, magnetic field sensors, etc. For processing the sensor signals captured by the MEMS, MEMS sensors are generally connected with an Application Specific Integrated Circuit (ASIC). It is used for signal conditioning, converting the analog signal of the MEMS to a digital or analogic signal output, which generally includes compensation of the sensor related to calibration data, acquired during calibration procedures and stored in the ASIC.

From European Patent Application No. 3309826 A1, it is known to form a cavity machined in a ceramic substrate for surrounding the MEMS component, thereby providing a gel-free device and reducing the footprint of the device. Indeed, when using a ceramic for the substrate, thinner walls for the cavity and/or the lid can be used. A ceramic lid is bonded to the substrate for protecting the MEMS component. However, the cavity formed in the isolating ceramic substrate requires providing wire-bonding connections for electrically connecting the MEMS component to other elements of the device.

SUMMARY

A device including a first layer, a MEMS component and/or an ASIC component on the first layer, and a second layer having a cavity receiving the MEMS component and/or the ASIC component. The second layer has a feedthrough for transmission of at least one of an electrical signal, an electromagnetic signal, a fluid, and a force.

BRIEF DESCRIPTION OF THE DRAWINGS

The invention will now be described by way of example with reference to the accompanying Figures, of which:

FIGS. 6A, 6B and 6C illustrate successive steps of the manufacturing process of the first layer according to the fourth embodiment of the invention;

FIGS. 7A, 7B and 7C illustrate successive steps of the manufacturing process of the second layer according to the fourth embodiment of the invention;

FIGS. 8A and 8B illustrate assembly steps of the first layer and the second layer according to fourth embodiment of the invention;

FIGS. 9A and 9B illustrate assembly steps of the third layer according to the fourth embodiment of the invention;

DETAILED DESCRIPTION OF THE EMBODIMENT(S)

Figure 1:
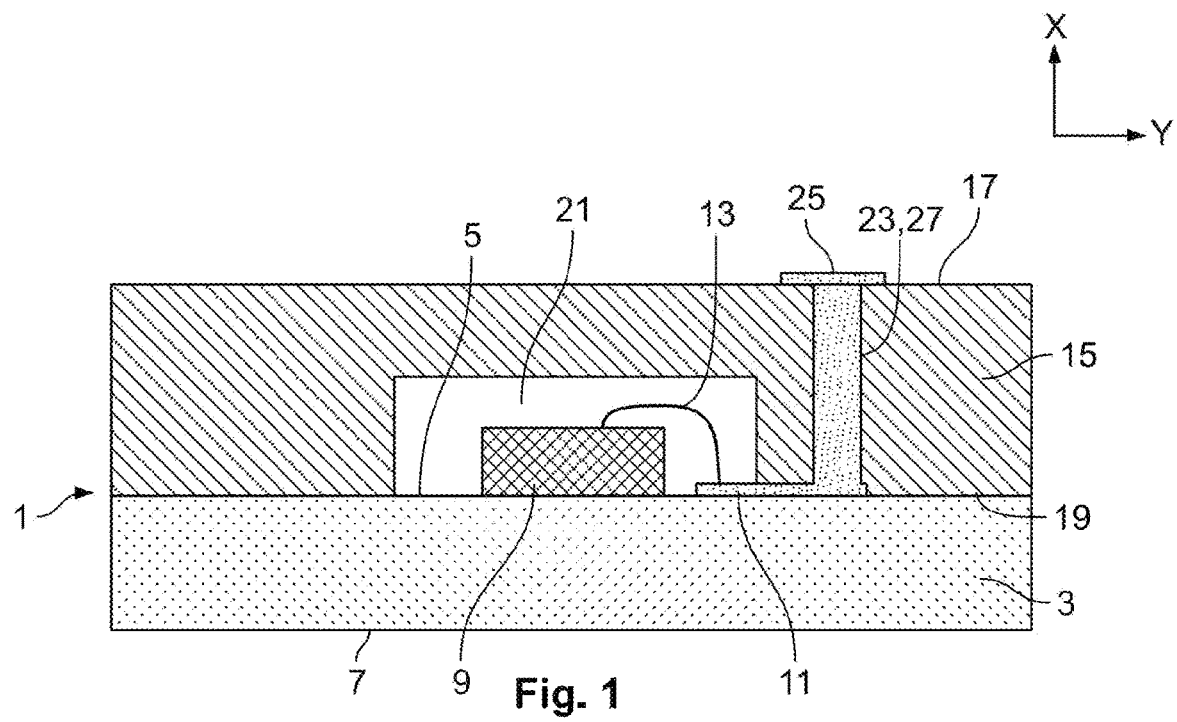
FIG. 1 illustrates a cut-view of a device according to a first embodiment of the invention.

Features and advantages of the invention will be described with reference to the drawings. In the description, reference is made to the accompanying figures that are meant to illustrate embodiments of the invention. It is understood that such embodiments do not represent the full scope of the invention.

The accompanying drawings are incorporated into the specification and form a part of the specification to illustrate several embodiments of the present invention. These drawings, together with the description, explain the principles of the invention. The drawings are merely for the purpose of illustrating examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements.

Various structures, systems and devices are schematically depicted in the drawings for purposes of explanation only and so as to not obscure the present disclosure with details. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein.

A device 1 according to a first embodiment is shown in FIG. 1. The device 1 comprises at least one MEMS component or ASIC component. The device 1 comprises a first layer 3 having a first surface 5 and a second surface 7, opposite to the first surface 5 along the axis X of the Cartesian coordinates shown in FIG. 1.

As shown in FIG. 1, a first MEMS component or ASIC component 9 is provided on a first surface 5 of the first layer 3. The first layer 3 is a functional layer, such as a substrate, provided on its first surface 5 with electrically conductive traces 11, like printed circuits 11, to which the MEMS or ASIC component 9 is electrically connected by wire bonding 13. The conductive traces 11 can be formed by a printed pattern of circuits or a printed patterns of dielectric material. In a variant, the second surface 7 of the first layer 3 can also be provided with electrically conductive traces.

The device 1, as shown in FIG. 1, further comprises a second layer 15 provided on or over the first layer 3. The second layer 15 has a first surface 17 and a second surface 19, opposite to the first surface 17 along the axis X of the Cartesian coordinates shown in FIG. 1. The second layer 15 is formed from an electrically isolating material, in particular of a ceramic. The second layer 15 is attached to the first layer 3 by adhesive bonding, for example with an isolating adhesive.

The second layer 15 comprises a cavity 21 shown in FIG. 1. The cavity 21 is formed by a recess 21 partially extending along the axis X from the second surface 19 towards the first surface 17 through the second layer 15. The cavity 21 receives the MEMS or ASIC component 9. The dimension of the cavity 21 is thus adapted to the size of the MEMS or ASIC component 9. Thanks to the material properties of ceramic, the thickness of the walls forming the cavity 21 of the second layer 15 can advantageously be reduced. Moreover, a ceramic cavity array can be manufactured with high accuracy and it can be handled and further processed in a simple manner.

The second layer 15 further comprises one feedthrough 23 extending from the second surface 19 to the first surface 17. The feedthrough 23 extends along the axis X of the Cartesian coordinates shown in FIG. 1. The feedthrough 23 is distinct from the cavity 21.

In the first embodiment, the feedthrough 23 is filled with an electrically conductive material 25. Therefore, the feedthrough 23 shown in FIG. 1 is a via 27. The electrically conductive material 25 is connected to the electrically conductive traces 11 on the interface of the first surface 5 of the first layer 3 and the second layer 19 of the second layer 15.

The feedthrough 23 thus provides to the second layer 15 a simplified element for electrical connection of the MEMS or ASIC component 9. In a variant, the feedthrough 23 is a hollow tube covered by a layer of electrically conductive material. A hollow feedthrough is adapted for transmission of an electrical and/or an electromagnetic signal of a fluid or a force.

The at least one feedthrough 23, which is distinct from the cavity 21, provides a simpler solution for the transmission of an electrical signal and/or an electromagnetic signal, a fluid or a force compared to the state in the art using wires for electrical signal and/or an electromagnetic signal, and not comprising a means for fluid or force transmission. In addition, the second layer 15 can thus be provided with an additional function, that is to say not only allowing protecting the MEMS and/or ASIC component 9 but also allowing the transmission of a signal or fluid or even a force by the at least one feedthrough 23. Thus, the assembly of the MEMS and/or ASIC components 9 can be simplified by using the feedthrough 23 for electrical connection according to the invention. The feedthrough 23 provided in the second layer 15 can therefore reduce wire or cable tangle.

Figure 2:
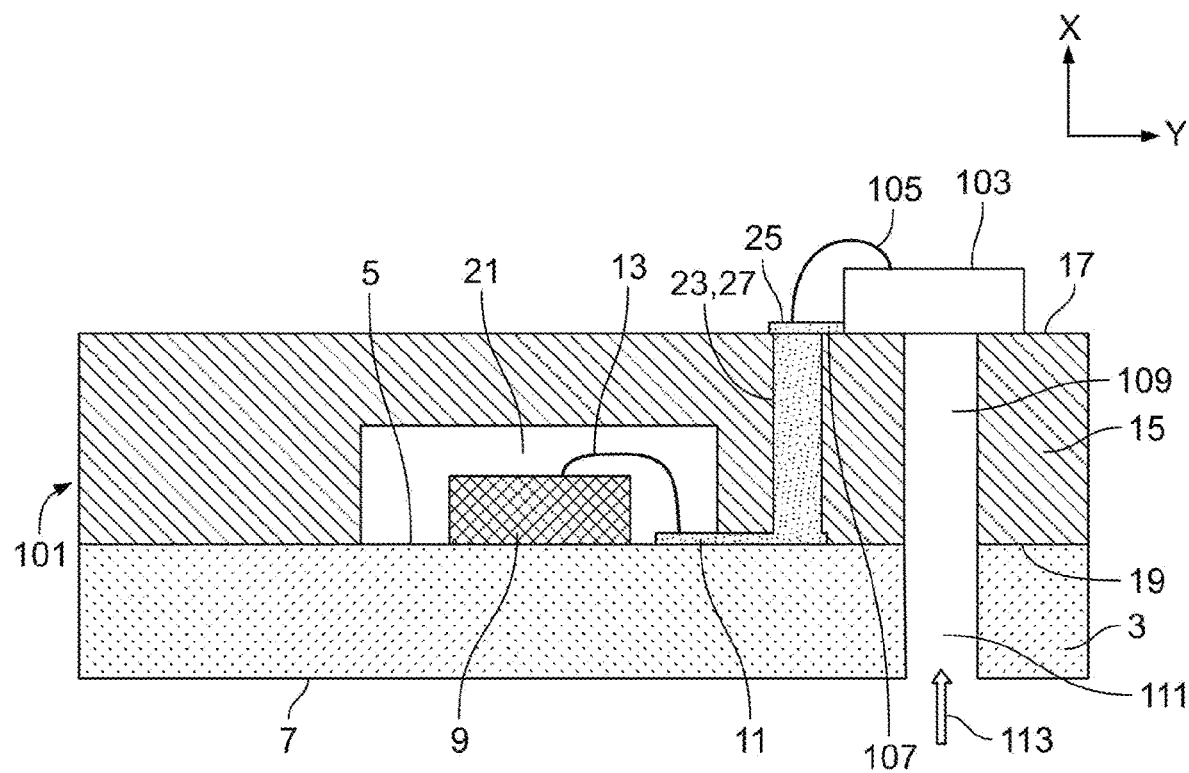
FIG. 2 illustrates a cut-view of a device according to a second embodiment of the invention.

FIG. 2 illustrates a cut-view of a device 101 according to a second embodiment of the invention. Elements having the same reference numeral already described and illustrated in FIG. 1 will not be described in detail again, but reference is made to their description above.

As the device 1 illustrated in FIG. 1, the device 101 is a device for supporting at least one MEMS component or ASIC component. The device 101 in FIG. 2 according to the second embodiment differs from the first embodiment in that a further MEMS or ASIC component 103 is provided on or over the first surface 17 of the second layer 15. The MEMS or ASIC component 103 is connected by wire bonding 105 to electrically conductive traces 107 provided on the first surface 17 of the second layer 15. The electrically conductive traces 107 are electrically connected to the electrically conductive material 25 of the feedthrough 23. Hence, the feedthrough 23, which is in the illustrated example a via 27, provides a wireless electrical connection between the MEMS or ASIC component 103 of the second layer 15 and the component 9 of the first layer 3. In the variant wherein the feedthrough 23 is a hollow tube covered by a layer of electrically conductive material, the MEMS or ASIC component 103 can be electrically and fluidically, or only fluidically, connected to the first layer 15 by the feedthrough 23.

The device 101 according to the second embodiment further differs from the first embodiment in that the second layer 15 comprises a second feedthrough 109 shown in FIG. 2, in addition to the first feedthrough 23, extending along the axis X from the second surface 19 to the first surface 17. The second feedthrough 109 is distinct from the first feedthrough 23 and from the cavity 21 of the second layer 15.

In the second embodiment, the first layer 3 comprises a feedthrough 111 extending along the axis X from the first surface 5 to the second surface 7. The feedthrough 111 of the first layer 3 and the second feedthrough 109 of the second layer 15 are arranged such that the feedthrough 111 is aligned with the second feedthrough 109 in the second layer 15. In the example shown in FIG. 2, the feedthrough 111 of the first layer 3 and the second feedthrough 109 of the second layer 15 have the same diameter and are aligned with respect to each other along the axis X.

It allows transmitting a fluid or a force (e.g. by a stamp or a bar for a solid media transmission) to the MEMS or ASIC component 103 from the second surface 7 of the first layer 3, as indicated by the arrow 113.

Figure 3A:
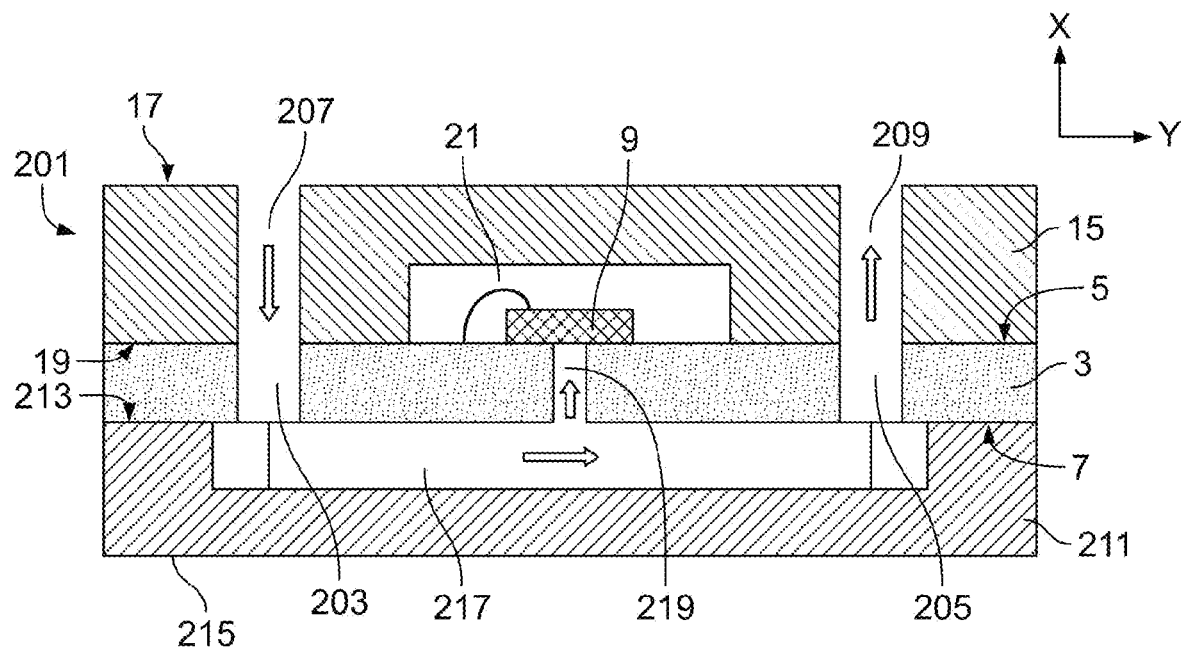
FIG. 3A illustrates a cut-view of a device according to a third embodiment of the invention.

FIG. 3A illustrates a cut-view of a device 201 according to a third embodiment of the invention. Elements having the same reference numeral already described and illustrated in FIGS. 1 and 2 will not be described in detail again but reference is made to their description above. As the device 1 illustrated in FIG. 1, the device 201 is a device for supporting at least one MEMS component or ASIC component. The device 201 according to the third embodiment differs from the first and the second embodiments in that the device 201 comprises three stacked layers, instead of two.

The device 201, as shown in FIG. 3A, comprises a first layer 3 provided on its first surface 5 with the MEMS or ASIC component 9. The first layer 3 comprises a first feedthrough 203 and a second feedthrough 205 extending from the first surface 5 to the second surface 7 along the axis X. The MEMS or ASIC component 9 is arranged on the first surface 5 so as to be disposed between the first feedthrough 203 and the second feedthrough 205.

The device 201 comprises a second layer 15 provided on the first layer 3, as shown in FIG. 3A. The second layer 15 comprises first feedthrough 207 and a second feedthrough 209 extending from the first surface 17 to the second surface 19 along the axis X. As shown in FIG. 2, the first feedthrough 203 of the first layer 3 is in direct connection with the first feedthrough 207 of the second layer 15. The second feedthrough 205 of the first layer 3 is in direct connection with the second feedthrough 209 of the second layer 15.

The device 201 according to the third embodiment further comprises a third layer 211. The third layer 211 has a first surface 213 and a second surface 215, opposite to the first surface 213 along the axis X of the Cartesian coordinates shown in FIG. 3A. The second surface 7 of the first layer 3 is disposed over the first surface 213 of the third layer 211. The third layer 211 comprises a groove 217 provided on the first surface 213 and partially extending into the third layer 211 towards the second surface 215 along the X axis. The grooves 217 extends longitudinally along the Y axis from the first feedthrough 203 to the second feedthrough 205 of the first layer 3. Thereby, a direct connection, e.g. a fluidic connection, is formed, as indicated by the arrows, from the first surface 17 of the second layer 25 through the feedthroughs 207, 203, the groove 217, and the feedthroughs 205, 209. Hence, a fluid can pass though the device 201 from the first surface 17.

The first layer 3 comprises a third feedthrough 219 extending from the first surface 5 of the first layer 3 to the groove 217 of the third layer 211. As shown in FIG. 3A, the MEMS or ASIC component 9 is disposed on the first surface 5 over the third feedthrough 219. The third feedthrough 219 allows a fluidic connection between the groove 217 and the MEMS or ASIC component 9.

Figure 3B:
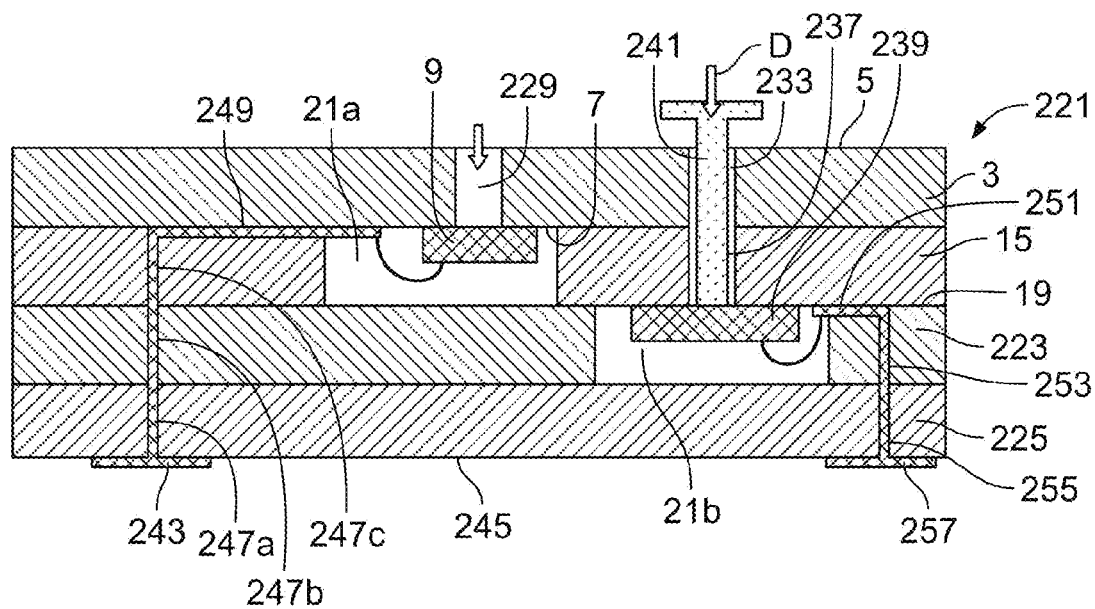
FIG. 3B illustrates a cut-view of a device according to a variant of the third embodiment of the invention.

FIG. 3B illustrates a cut-view of a device 221 according to a variant of the third embodiment of the invention. Elements having the same reference numeral already described and illustrated in FIGS. 1, 2 and 3A will not be described in detail again but reference is made to their description above.

As in the device 201 according to the third embodiment, the device 221 shown in FIG. 3B comprises more than two layers. In contrast with the device 201 that comprises three layers, the device 221 comprises four layers: the first layer 3, the second layer 15, a third layer 223 and a fourth layer 225.

The MEMS or ASIC component 9 is provided on or over the surface 7 of the first layer 3.

The first layer 3 comprises a feedthrough 229 that fluidly connects the surface 5 of the first layer 3 to the MEMS or ASIC component 9. The first layer 3 further comprises a feedthrough 233 which is aligned with a corresponding feedthrough 237 in the second layer 15. The second layer 15 further comprises a recess 21a for receiving the MEMS or ASIC component 9. The feedthrough 237 in the second layer 15, aligned with the feedthrough 233 of the first layer 3, allows passing a stamp (or bar or rod or solid pin) 241 displaceable along the direction D for force transmission to the MEMS or ASIC component 239, as shown in FIG. 3B.

A further MEMS or ASIC component 239 is provided on or over the surface 19 of the second layer 15, as shown in FIG. 3B. The MEMS or ASIC component 239 is received in a cavity 21b provided in the third layer 223. The through cavity 242 is closed by the fourth layer 225, thereby enclosing the MEMS or ASIC component 239 in the cavity 21b.

As illustrated in FIG. 3B, the MEMS or ASIC component 9 is electrically connected to a contact pad 243 disposed on or over the backside 245 of the fourth layer 225 by vias 247a, 247b, 247c, i.e. feedthroughs filled out with electrically conductive material, of respectively the fourth layer 225, the third layer 223 and the second layer 15. The via 247c of the second layer 15 is electrically connected to a conductive trace 249 (like a printed circuit) to which the MEMS or ASIC component 9 is wire-bonded.

In a similar manner, the MEMS or ASIC component 239 is wire-bonded to a conductive trace 251 (like a printed circuit) which is electrically connected to a via 253 extending through the third layer 223, as shown in FIG. 3B. The via 253 is aligned with a via 255 extending through the fourth layer 225 until a contact pad 257 provided on the backside 245 of the fourth layer 225.

Thereby, the MEMS component and/or ASIC components can be provided on both opposing and facing layers of the device, thus improving the compactness of the device because the volume, and therefore the footprint of the device, can be reduced. It shall be noted that the number of layers, the numbers of MEMS and/and ASIC component and the arrangement of such components and feedthroughs are not limited to the above-described embodiments. Moreover, the arrangement and the structure of each embodiment described above can be combined.

According to one embodiment, the at least one further MEMS component and/or the further ASIC component of the third layer and the first MEMS component and/or ASIC component of the first layer can be provided in the same cavity in the second layer, the cavity thereby extending through the second layer. The footprint of the device can be further reduced by receiving the MEMS and/or ASIC component of the first layer and the further MEMS or ASIC component of the third layer into one common cavity in the second layer.

Figure 4:
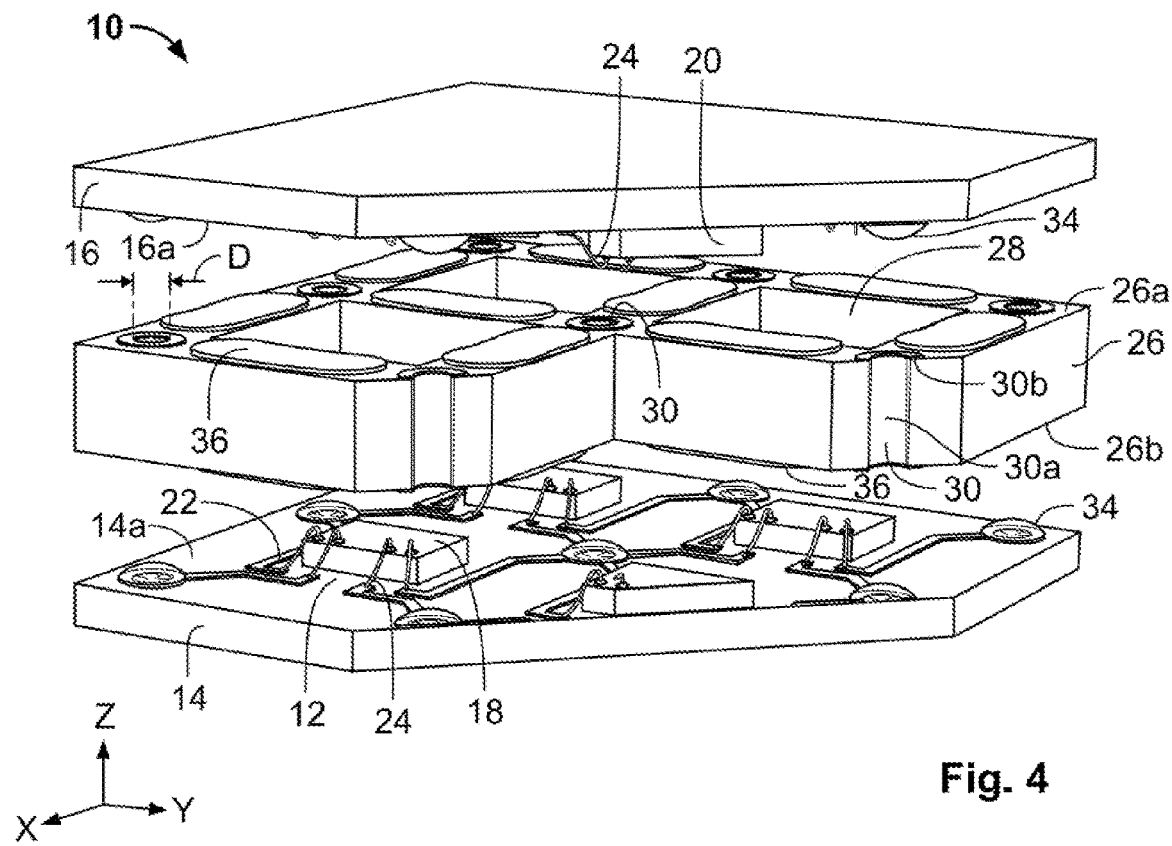
FIG. 4 illustrates an exploded view of an array of devices for supporting MEMS and ASIC components according to a fourth embodiment of the invention.

FIG. 4 illustrates an exploded view of an array 10 of devices 12 according to a fourth embodiment of the invention. The array 10 is an array of devices for supporting MEMS components only, or MEMS and ASIC components. The devices 12 are formed in an array 10 with rows and lines. Each device 12 of the array 10 is the same. Thus, in the followings, the description of the present invention is made towards one device 12 for sake of clarity. The description of one device 12 thereby applies for the other devices 12 of the array 10.

In the fourth embodiment, as shown in FIG. 4, the device 12 comprises three layers. The device 12 comprises a first layer 14, corresponding to a bottom substrate 14 and a third layer 16, corresponding to a top substrate 16.

A first functional component 18, such as an ASIC or a MEMS component 18, is provided on a surface 14a of the first layer 14. In the embodiment illustrated by FIG. 1, the first functional component 18 is an ASIC component.

A second functional component 20, such as a MEMS component 20, is provided on a surface 16a of the third layer 16. In a variant, the first functional component 18 is a MEMS component instead of an ASIC component. In such variant, each device 12 therefore comprises two MEMS components 18, 20 respectively provided on the first layer 14 and the third layer 16. Accordingly, the description of the ASIC component 18 thereafter applies to the variant wherein the first functional component 18 is a MEMS component 18.

Each surface 14a, 16a of respectively the first layer 14 and the third layer 16 are further provided with printed circuits 22. The functional components 18, 20 are electrically connected to the printed circuits 22 by wire bonding. The FIG. 4 shows the wires 24 between the first ASIC component 18 and the printed circuit 22 provided on the surface 14a of the first layer 14. Although it cannot be seen in the view represented in FIG. 4, the second MEMS component 20 is respectively electrically connected by wire bonding to the printed circuit 22 provided on the surface 16a of the third layer 16.

The device 12 further comprises a second layer 26, such as a spacing plate 26 in the fourth embodiment, disposed between the first layer 14 and the third layer 16 along a first direction, said first direction being parallel the Z-direction of the Cartesian coordinate system represented in FIG. 4.

Figure 5:
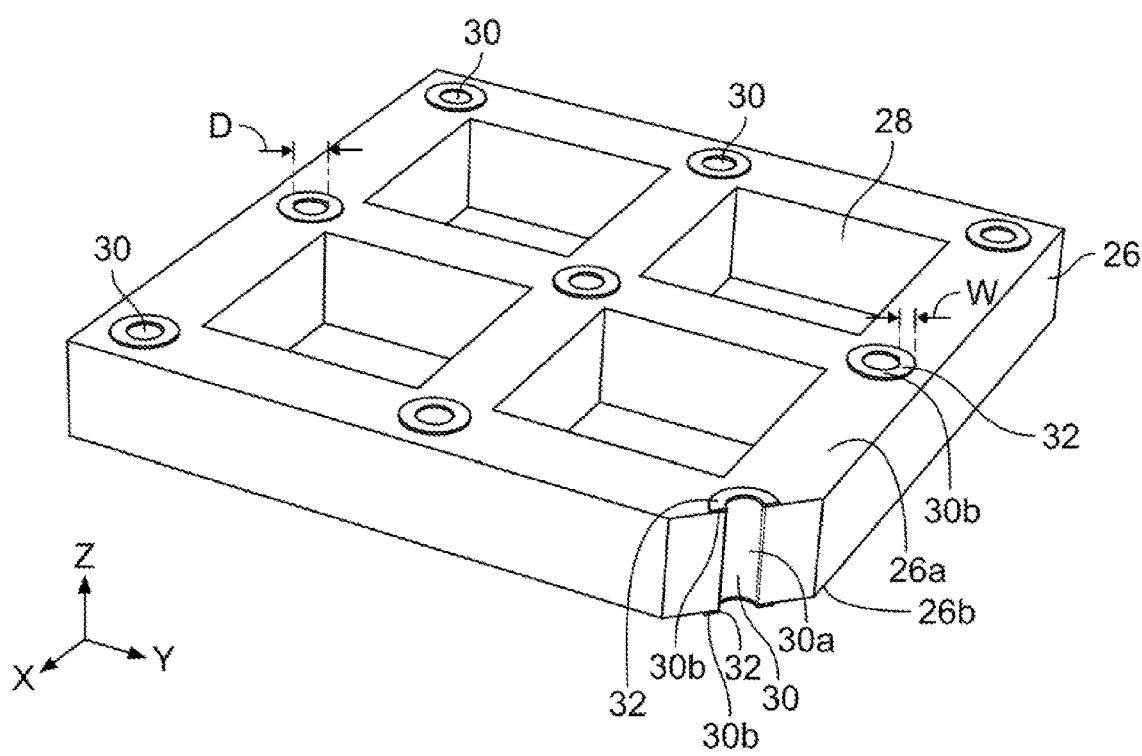
FIG. 5 illustrates a second layer according to the fourth embodiment of the invention for an array of devices.

FIG. 5 illustrates the second layer 26 according to the fourth embodiment of the present invention. The second layer 26 is integrally made in one-piece. The second layer 26 is made of ceramic or any suitable material for printed circuit board. For each device 12, the second layer 26 is provided with a through cavity 28 dimensioned for accommodating both of the functional components 18, 20. Arrays of cavity 28 are manufactured within the second layer 26 by cutting or dicing a portion of the second layer 26 along the first direction, i.e. the Z-direction of the Cartesian coordinate system, from a first surface 26a to a second surface 26b of the second layer 26, the second surface 26a being opposite to the first surface 26b along the first direction. In the fourth embodiment illustrated in FIGS. 4 and 5, each cavity 28 has a rectangular cross-section with dimensions adapted for accommodating the functional components 18, 20.

According to the present invention, the second layer 26 further comprises an array of feedthroughs 30 distinct from the cavities 28, as shown in FIG. 5. A plurality of feedthroughs 30 are manufactured in an array of devices 12. Each single device 12 is formed by cutting the array into individual device. By cutting the array, the feedthroughs 30 are also cut such that each single device 12 is at least provided on one corner with a groove, the groove being a cut portion of the feedthrough 30. The method for manufacturing a device 12 according to the fourth embodiment will be further described in relation with the FIGS. 6a-c, 7a-c, 8a-b and 9a-b.

Each feedthrough 30 extends along the first direction from the first surface 26a to the second surface 26b of the second layer 26. The feedthrough 30 can be configured to transmit electrical or electromagnetic energy, electrical or electromagnetic signals, liquid, gas or solid. Each feedthrough 30 can have a circular cross-section. The diameter D of each feedthrough 30 can be comprised between 0.1 mm and 10 mm. In a variant, each feedthrough 30 or at least one feedthrough 30, has an oblong cross-section.

Each feedthrough 30 is covered by an electrically conductive layer 32 along the inner wall 30a of the feedthrough 30. As can be seen in FIGS. 4 and 5, despite the deposit of the electrically conductive layer 32 on the inner wall 30a, the feedthrough 30 remains hollow.

In a variant, the feedthrough 30 can be filled out with an electrically conductive material from the first surface 26a to the second surface 26b of the second layer 26. In this case, the feedthrough 30 is a via.

As can be seen in FIGS. 4 and 5, an electrically conductive layer 32 is applied on the circumference 30b, i.e. the surrounding 30b, of the feedthrough 30 on the first surface 26a and on the second surface 26b of the second layer 26. Said deposit of conductive layer 32 in the surrounding 30b can correspond to a circular ring 32 around the feedthrough 30 having a width W that can be comprised between 0.1 to 10 mm, in particular between 0.05 to 1 mm.

For each feedthrough 30, the conductive layer 32 at the surrounding 30b of each surface 26a, 26b on the second layer 26 is connected to the electrically conductive layer 32 disposed on the inner wall 30a so as to ensure the electrical continuity between the first surface 26a and the second surface 26b of the second layer 26 via the feedthrough 30.

In a variant, the second layer 26 can have printed patterns of dielectric material on its first surface 26a and on its second surface 26b, as explained with respect to the first and the second embodiments.

As illustrated in FIG. 4, for each of the first layer 14 and the third layer 16, dots of electrically conductive glue 34 are disposed on the printed circuit 22. The dots of electrically conductive glue 34 are disposed so as to come into contact with the surrounding 30b on each surface 26a, 26b of the feedthrough 30 wherein the electrically conductive layer 32 is applied. As an alternative to the electrically conductive glue 34, solder balls could be used.

Hence, a dot of electrically conductive glue 34 provided on the surface 14a of the first layer 14 comes into contact with the conductive layer 32 of the surrounding 30b of the second surface 26b of the second layer 26. Respectively, a dot of electrically conductive glue 34 provided on the surface 16a of the third layer 16 comes into contact with the conductive layer 32 of the surrounding 30b of the first surface 26a of the second layer 26. Consequently, the electrical connection between the first layer 14, i.e. the first substrate 14, and the third layer 16, i.e. the second substrate 16, is realized by the feedthrough 30 of the second layer 26 disposed therebetween along the first direction (i.e. along the Z-axis).

As can be seen in FIG. 4, patches 36 of non-electrically conductive glue are provided on the first surface 26a and on the second surface 26b of the second layer 26 so as to improve the attachment on the array 10 of devices 12. The patches 36 of non-electrically conductive glue are disposed so as to be distinct from the electrically conductive layer 32 of the surrounding 30b of the feedthrough 30.

As it will be further described in the following, each feedthrough 30 can be cut or diced so that one feedthrough 30 can serve for the electrical connection of two, three or four devices 12.

FIGS. 6A-C, 7A-C, 8A-B, and 9A-B illustrate a method for manufacturing a device 12 for supporting the ASIC and MEMS components 18, 20 according to the fourth embodiment of the invention. Elements having the same reference numeral already described and illustrated in FIGS. 4 and 5 will not be described in detail again but reference is made to their description above.

At the step illustrated in FIG. 6A, an array of printed circuits 22 is provided on the surface 14a of the first layer 14.

At the step illustrated in FIG. 6B, ASIC components 18 are provided on the surface 14a of the first layer 14 and electrically connected to the printed circuit 22 by wire bonding 24. In a variant, MEMS components 18 can be provided on the surface 14a of the first layer 14 instead of ASIC component.

At the step illustrated in FIG. 6C, dots of electrically conductive glue 34 are provided on the printed circuit 22 of the first layer 14.

The steps illustrated in FIGS. 6A to 6C are the same for the surface 16a of the third layer 16 and will thus not be described again.

At the step illustrated in FIG. 7A, an array of through cavities 28 and an array of feedthroughs 30 are formed in the second layer 26 by cutting the second layer 26 from its first surface 26a to its second surface 26b. The cavities 28 are dimensioned for accommodating the functional components 18, 20 of the first layer 14 and the third layer 16.

At the step illustrated in FIG. 7B, each circumference 30b, i.e. each surrounding 30b of each feedthrough 30 on the first 26a and the second 26b surfaces of the second layer 26 are covered by an electrical conductive layer 12. The inner wall (30a) of each feedthrough 30 is also covered by an electrically conductive layer 12. For each feedthrough 30, the electrically conductive layer 12 at the surrounding 30b of each surface 26a, 26b on the second layer 26 is connected to the electrically conductive layer 12 disposed on the inner wall of the feedthrough 30 so as to ensure the electrical continuity between the first surface 26a and the second surface 26b of the second layer 26 via the feedthrough 30.

At the step illustrated in FIG. 7C, patches 36 of non-electrically conductive glue are provided on the second surface 26b of the second layer 26. The patches 36 of non-electrically conductive glue are disposed so as to be distinct from the electrically conductive layer 32 of the surrounding 30b of the feedthrough 30.

At the step illustrated in FIG. 8A, the second surface 26b of the second layer 26 is assembled and attached by adhesive bonding to the surface 14a of the first layer 14.

Thereby, at the following step illustrated in FIG. 8B, each ASIC component 18 of the first layer 14 is disposed inside a respective cavity 28 of the second layer 26 so as to be surrounding by walls of a cavity 28 of the second layer 16. Each dot of electrically conductive glue 34 is in contact with the electrically conductive layer 32 provided on each feedthrough surrounding 30b on the second surface 26b of the second layer 26. The patches 36 of non-conductive glue provided on the second surface 26b of the second layer 26 allow improving the attachment of the second layer 26 to the surface 14a of the first layer 14.

At the step illustrated in FIG. 8B, patches 36 of non-electrically conductive glue are provided on the first surface 26a of the second layer 26. The patches 36 of non-conductive glue are disposed so as to be distinct from the electrically conductive layer 32 of the surrounding 30b of the feedthrough 30.

At the step illustrated in FIG. 9A, the surface 16a of the third layer 16 is assembled and attached by adhesive bonding to first surface 26a of the second layer 26. As mentioned above, the surface 16a of the third layer 16 has been prepared according to the steps illustrated in FIGS. 6A to 6C.

Thereby, at the following step illustrated in FIG. 9B, each MEMS component 20 of the third layer 16 is received inside a respective cavity 28 of the second layer 26 so as to be surrounding by walls of the second layer 16. Each dot of electrically conductive glue 34 is in contact with the electrically conductive layer 32 provided on each feedthrough surrounding 30b on the first surface 26a of the second layer 26.

The patches 36 of non-electrically conductive glue provided on the first surface 26b of the second layer 26 allow improving the attachment of the second layer 26 to the surface 16a of the third layer 16. At step FIG. 9B, an array 10 according to the fourth embodiment of the present invention is thus obtained.

Figure 10A:
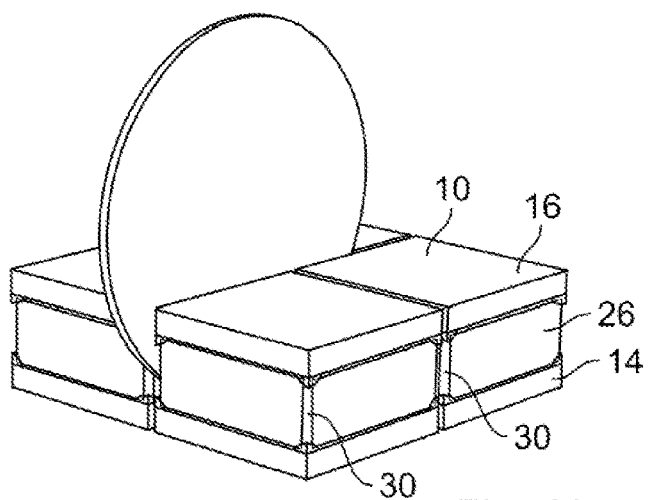
FIGS. 10A and 10B illustrate cutting steps of an array according to the fourth embodiment of the invention.
Figure 10B:
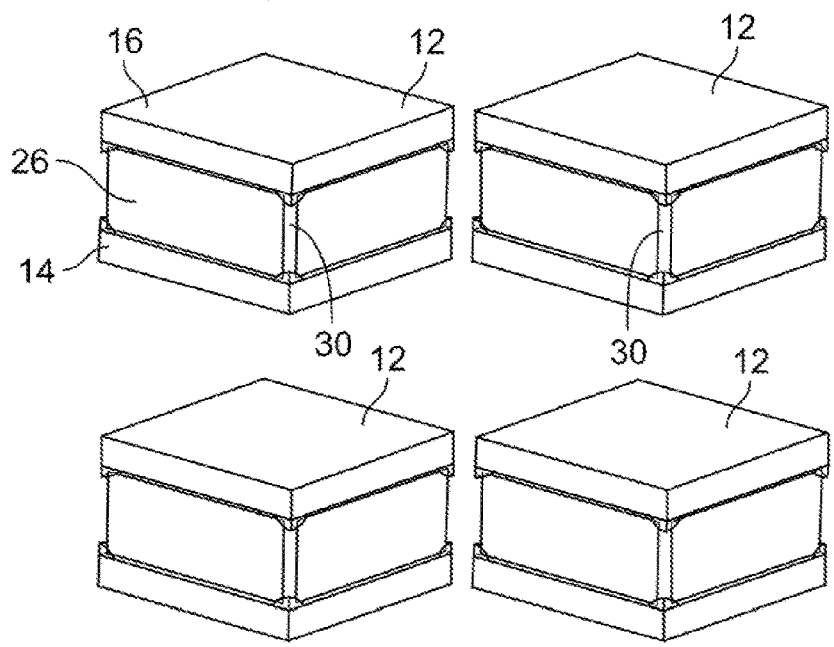

FIG. 10A illustrates a step of cutting (slicing or dicing) the array 10 into individual devices 12, as illustrated in FIG. 10B. After the cutting or dicing step, one feedthrough 30 can electrically connect two to four devices 12.

Figure 11:
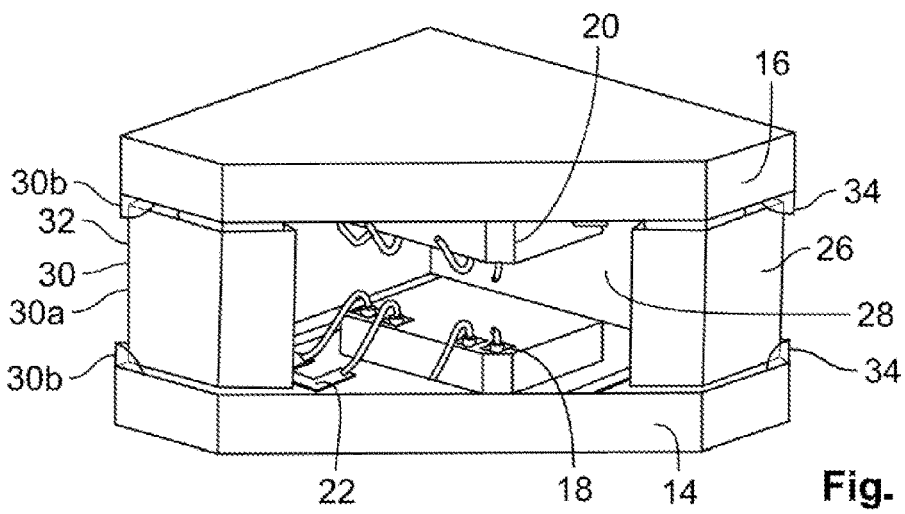
FIG. 11 illustrates a cut-view of the device according to the fourth embodiment of the invention.

As shown in the cut-view of the device 12 represented in FIG. 11, the method according to the fourth embodiment allows obtaining a device 12 wherein the functional components 18, 20 provided on each surfaces 14a, 16a of the first and third layers 14, 16 are at least partially facing each other, thus improving the compactness of the device 12. The electrical connection is simplified by the feedthroughs 30, or portion of feedthroughs 30 resulting from the cutting process, and which are covered by the electrically conductive layer 32. Hence, the use of wire bonding from the second MEMS component 20 to the first layer 14 is not necessary, thereby avoiding a tangle of wires between the first 14 and the third 16 layers. Indeed, the electrical connection between the first 14 and the third 16 layers is achieved via the feedthroughs 30 comprised in the second layer 26.

Further, the device 12 obtained by the method allows protecting the functional components 18, 20 in the cavity 28 of the second layer 26 from the external environment, the third layer 16 acting both as a substrate and a lid. The device 12 is thus particularly adapted for application under harsh environment without requiring to be filled with gel.

Figure 12:
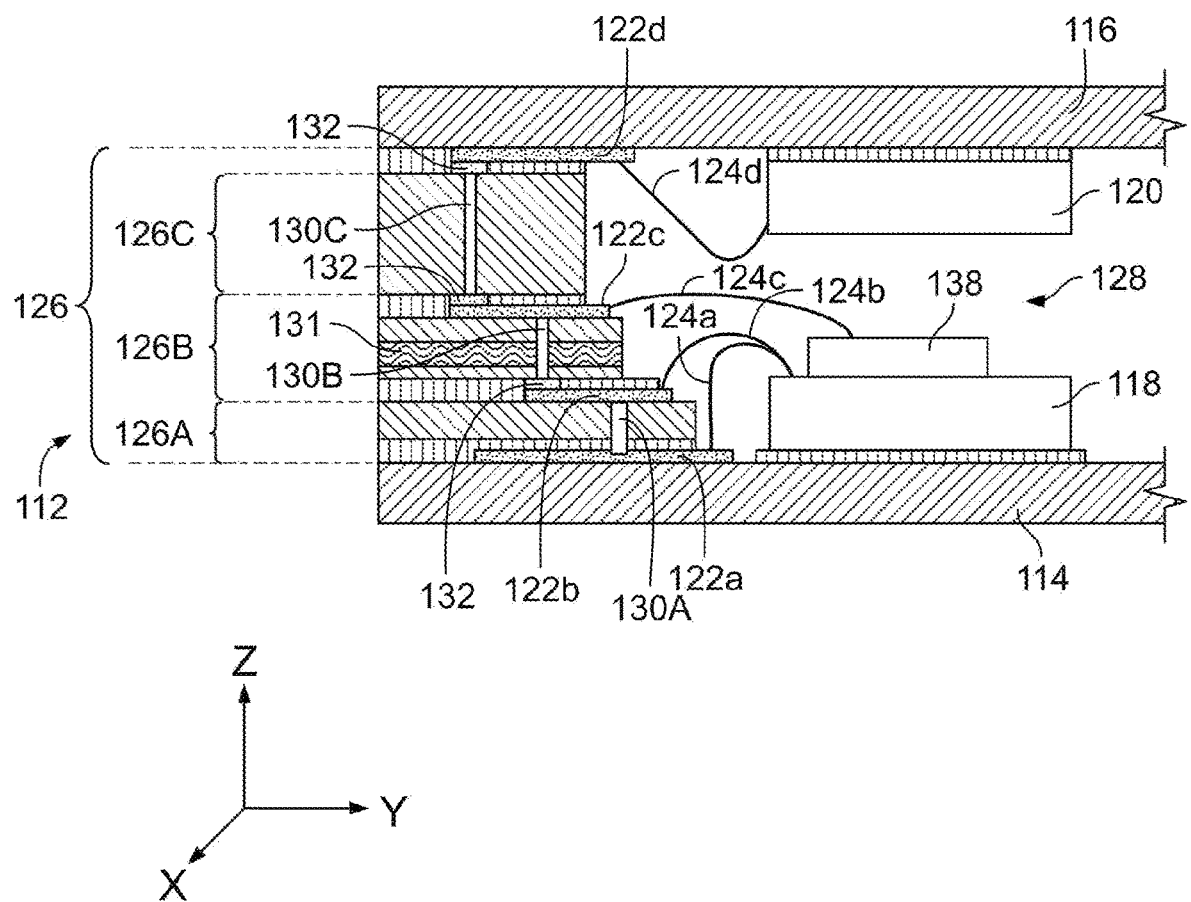
FIG. 12 illustrates a partial cut-view of a device according to a fifth embodiment of the present invention.

FIG. 12 illustrates a partial view of a device 112 according to a fifth embodiment of the present invention. The references in FIG. 12 with the same tens as the references described in the fourth embodiment relate to the same element. Hence, these references will not be described in detail again, and reference is made to the description of the fourth embodiment. The device 112 according to the fifth embodiment differs from the fourth embodiment in that a plurality of layer is disposed between the first layer 114 and the second layer 116, instead one second layer 126 only. The device 112 further differs from the fourth embodiment in that a functional component such as a MEMS, is stacked over the first MEMS or ASIC component provided on the first layer 114.

According to the fifth embodiment shown in FIG. 12, the spacing plate 126, in comparison with the second layer 26 of the fourth embodiment, is formed by three intermediate plates 126A, 126B, 126C stacked on each other. Each of the intermediate plates 126A, 126B, 126C can have different shapes and distribution. Each intermediate plates 126A, 126B, 126C can thus be provided with different arrangement of printed circuits and can be individually connected to any feedthroughs. Thereby, as further described in the following, multiple layers of functions is rendered possible, such as intermediary wire-bonding area for stacked ASICs or MEMS, embedded cavities, re-distribution of the circuitry between the stacks of plates.

In the cavity 128, as shown in FIG. 12, a first ASIC component 118 is attached to the first layer 114, on which a printed circuit 122a is provided. In a variant, the first functional component 118 is a MEMS component instead of an ASIC component. Accordingly, the description of the ASIC component 118 thereafter applies to the variant wherein the component 118 is a MEMS component 118. A second component 120, being a MEMS component 120, is attached to the third layer 116, on which a printed circuit 122d is provided.

In the fifth embodiment shown in FIG. 12, a layer 138 of electronic device comprising a functional component like a MEMS, such as an accelerometer or a pressure sensor, is stacked on the ASIC component 118. In a variant, the layer 138 of electronic device can comprise an ASIC component instead of a MEMS component. In another variant, the layer 138 of electronic device can comprise a MEMS and an ASIC components. In a variant, at least two layers of electronic device could be stacked on the first functional component 118 and/or on the second functional component 120. Stacking a MEMS component 138 on an ASIC component 118 allows signal conditioning and converting the analog signal of MEMS to digital or analogic signal output.

As shown in the embodiment of FIG. 12, the ASIC component 118 is electrically connected by a wire 124a to the printed circuit 122a provided on the first layer 114. The ASIC component 118 is further electrically connected by a wire 124b to the printed circuit 122b provided on the first intermediate plate 126A of the spacing plate 126. The layer 138 of electronic device is electrically connected by a wire 124c to the printed circuit 122c provided on the second intermediate plate 126B of the spacing plate 126. Further, the MEMS component 120 is electrically connected by a wire 124d to the printed circuit 122d provided on the third layer 116.

The first and third layers 114, 116 and the intermediate plates 126A, 126B, 126C are separated by non-electrically conductive layers and are electrically connected to each other by feedthrough as described in the following with respect to FIG. 12.

The printed circuit 122a of the first layer 114 and the printed circuit 122b of the first intermediate plate 126A are electrically connected by the feedthrough 130A.

The printed circuit 122b of the first intermediate plate 126A and the printed circuit 122c of the second intermediate plate 126B are electrically connected by the feedthrough 130B.

Besides the feedthrough 130B, the second intermediate plate 126B is provided with a venting hole 131 (i.e. an hollow tube) extending along a direction transversal to the longitudinal central axis of the feedthrough 130B, i.e. transversal to the first direction. Such venting hole 131 can allow passing air, liquid or solid media towards the cavity 128 comprising the ASIC 118, 120, 138 for sensing (e.g. for determining the pressure).

In a variant, not represented in FIG. 12, the device 112 can comprise a hollow feedthrough extending along the first direction from the cavity 128 to the outside of the device 112 throughout the first layer 114 and the intermediary plate 126A.

The printed circuit 122d of the third layer 116 and the printed circuit 122c of the second intermediate plate 126B are electrically connected by the feedthrough 130C extending through the intermediate plate 126C of the spacing plate 126. Each end of the feedthrough 130C is covered by an electrically conductive layer 132 at the interface between the third layer 116 and the intermediate plate 126C and at the interface between the two intermediate plates 126B, 126C, and said electrically conductive layer 132 is therefore in contact respectively with the printed circuits 122c, 122d.

In the example represented in FIG. 12, the feedthroughs 126A, 126B and 126C are staggered from each other along the first direction (parallel to the axis Z). In a variant, at least two of the feedthroughs 126A, 126B and 126C could be aligned with each other along the first direction.

In a further variant not represented in FIG. 12, one of the intermediate plates 126B, 126C, can provide with a second cavity enclosing an additional MEMS component wire bonded to the first layer 114. This second cavity, which is distinct from the cavity 128 and the feedthroughs 130A-C, allows separating a sensing feature. It may indeed be necessary to isolate a pressure sensor from the cavity 128. In that example, the second cavity is provided with a through-hole for passing air to the outside of the device 112 to the cavity.

Although the embodiments have been described in relation to particular examples, the invention is not limited and numerous alterations to the disclosed embodiments can be made without departing from the scope of this invention. The various embodiments and examples are thus not intended to be limited to the particular forms disclosed. Rather, they include modifications and alternatives falling within the scope of the claims and individual features can be freely combined with each other to obtain further embodiments or examples according to the invention. It is to be understood that some or all of the above described features can also be combined in different ways.

What is claimed is:

1. A device, comprising:
   a first layer;
   a MEMS component and/or an ASIC component on the first layer; and
   a second layer having a cavity receiving the MEMS component and/or the ASIC component and a feedthrough for transmission of at least one of an electrical signal, an electromagnetic signal, a fluid, and a force, the second layer is formed in a single piece and has a first surface facing the first layer and a second surface opposite to the first surface, the second surface has a plurality of electrically conductive traces on the second surface.

2. The device of claim 1, wherein a surface of the feedthrough is at least partially covered by a layer of an electrically conductive material.

3. The device of claim 2, further comprising a further MEMS component and/or a further ASIC component disposed on or over the second layer.

4. The device of claim 3, wherein the further MEMS component and/or the further ASIC component is disposed on the second surface of the second layer.

5. The device of claim 3, wherein the further MEMS component and/or the further ASIC component is electrically and/or fluidically connected to the first layer by the feedthrough.

6. The device of claim 3, wherein the MEMS component and/or the ASIC component on the first layer is electrically connected to the further MEMS component and/or the further ASIC component on the second layer by the feedthrough and a plurality of electrically conductive traces on the second layer.

7. The device of claim 1, wherein the feedthrough is filled with an electrically conductive material.

8. The device of claim 1, wherein the first layer has a further feedthrough aligned with the feedthrough in the second layer.

9. The device of claim 1, further comprising:
   a third layer, the second layer arranged between the first layer and the third layer; and
   a further MEMS component and/or a further ASIC component disposed on or over the third layer.

10. The device of claim 9, wherein the further MEMS component and/or the further ASIC component of the third layer is in electrical and/or fluidic connection with the first layer via the feedthrough in the second layer.

11. The device of claim 10, wherein the further MEMS component and/or the further ASIC component is disposed on or over a surface of the third layer facing the second layer, the cavity or a further cavity of the second layer receives the further MEMS component and/or the further ASIC component of the third layer.

12. The device of claim 11, wherein the further MEMS component and/or the further ASIC component of the third layer and the MEMS component and/or the ASIC component of the first layer are disposed in a same cavity extending through the second layer.

13. The device of claim 9, wherein the third layer has a further feedthrough aligned with the feedthrough in the second layer.

14. The device of claim 1, wherein the second layer is formed from an electrically isolating material.

15. The device of claim 1, further comprising a further MEMS component and/or a further ASIC component disposed on or over the MEMS component and/or the ASIC component on the first layer.

16. The device of claim 15, wherein the MEMS component and/or the ASIC component of the first layer is electrically connected to the first layer and the further MEMS component and/or the further ASIC component is electrically connected to the second layer.

17. The device of claim 1, wherein the first layer and the second layer are attached to each other by an isolating adhesive.

18. The device of claim 1, wherein an electrically conductive glue or a solder bump forms an electrical connection between the first layer and the feedthrough of the second layer.

19. An array, comprising:
a plurality of devices, each of the devices including a first layer, a MEMS component and/or an ASIC component on the first layer, and a second layer having a cavity receiving the MEMS component and/or the ASIC component and a feedthrough for transmission of at least one of an electrical signal, an electromagnetic signal, a fluid, and a force, the second layer is formed in a single piece and has a first surface facing the first layer and a second surface opposite to the first surface, the second surface has a plurality of electrically conductive traces on the second surface, at least two of the devices share the feedthrough of the second layer.

* * * * *